United States Patent
Ikeda et al.

(10) Patent No.: US 10,159,166 B2
(45) Date of Patent: Dec. 18, 2018

(54) HEAT DISSIPATING STRUCTURE

(71) Applicant: SHINDENGEN ELECTRIC MANUFACTURING CO., LTD., Tokyo (JP)

(72) Inventors: Kosuke Ikeda, Hanno (JP); Yuji Morinaga, Hanno (JP); Osamu Matsuzaki, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 100 days.

(21) Appl. No.: 15/520,604

(22) PCT Filed: Apr. 13, 2015

(86) PCT No.: PCT/JP2015/061323
§ 371 (c)(1),
(2) Date: Apr. 20, 2017

(87) PCT Pub. No.: WO2016/067659
PCT Pub. Date: May 6, 2016

(65) Prior Publication Data
US 2017/0311482 A1    Oct. 26, 2017

(30) Foreign Application Priority Data
Oct. 29, 2014  (WO) .................. PCT/JP2014/078744

(51) Int. Cl.
*H05K 7/20* (2006.01)
*H01L 23/367* (2006.01)
(Continued)

(52) U.S. Cl.
CPC ......... *H05K 7/20409* (2013.01); *F28F 13/08* (2013.01); *H01L 23/36* (2013.01);
(Continued)

(58) Field of Classification Search
CPC .. H05K 7/2039–7/20518; H05K 7/209; H01H 9/52; H01L 23/367; H01L 23/3675; H01L 23/3672
(Continued)

(56) References Cited

U.S. PATENT DOCUMENTS 5,940,272 A    8/1999  Emori et al.
9,474,189 B2 * 10/2016  Kawauchi ............. H02M 7/003
(Continued)

FOREIGN PATENT DOCUMENTS

DE   10 2009 044 368 A1   5/2011
JP        57-202763       12/1982
(Continued)

OTHER PUBLICATIONS

International Search Report for PCT/JP2015/061323, dated Jun. 30, 2015, 4 pages.
(Continued)

*Primary Examiner* — Zachary Pape
(74) *Attorney, Agent, or Firm* — Nixon & Vanderhye P.C.

(57) ABSTRACT

A heat sink according to one embodiment of the present invention includes: a base portion having a first surface and a second surface which oppose each other; at least one heat dissipating fin extending vertically from the first surface, each of the at least one heat dissipating fin having an insertion groove extending from an end portion thereof toward the base portion, and a first fin portion and a second fin portion which are separated by the insertion move; and a connector included in the base portion, the connector being above the insertion groove in plan view, and the connector being configured to electrically connect a first heat generating component to be inserted into the insertion groove from a side of the first surface and a second heat generating component to be disposed on a side of the second surface.

9 Claims, 12 Drawing Sheets

(51) Int. Cl.
   *F28F 13/08* (2006.01)
   *H01L 25/07* (2006.01)
   *H01L 23/36* (2006.01)
   *H01L 25/18* (2006.01)
   *H05K 7/00* (2006.01)
   *H05K 7/10* (2006.01)
   *H01R 12/70* (2011.01)
   *F28F 13/00* (2006.01)

(52) U.S. Cl.
   CPC .......... *H01L 23/3672* (2013.01); *H01L 25/07* (2013.01); *H01L 25/072* (2013.01); *H01L 25/18* (2013.01); *H01R 12/7082* (2013.01); *H05K 7/005* (2013.01); *H05K 7/1053* (2013.01); *H05K 7/209* (2013.01); *F28F 2013/005* (2013.01); *H01L 2924/0002* (2013.01)

(58) Field of Classification Search
   USPC ....... 361/704, 709–710, 715; 165/80.1–80.3, 165/185; 257/712–713, 722
   See application file for complete search history.

(56) References Cited

U.S. PATENT DOCUMENTS

| | | | |
|---|---|---|---|
| 9,991,184 B2* | 6/2018 | Ikeda | H01L 23/42 |
| 2002/0180037 A1* | 12/2002 | Shirakawa | H01L 24/72 257/727 |
| 2007/0096278 A1 | 5/2007 | Nakatsu et al. | |
| 2007/0139896 A1 | 6/2007 | Yamada et al. | |
| 2008/0277780 A1 | 11/2008 | Hayakawa | |
| 2011/0100598 A1 | 5/2011 | Gömmel et al. | |
| 2017/0114993 A1* | 4/2017 | Kim | F21K 9/20 |

FOREIGN PATENT DOCUMENTS

| | | |
|---|---|---|
| JP | 58-158448 | 10/1983 |
| JP | 4-188861 | 7/1992 |
| JP | 5-069995 | 9/1993 |
| JP | 10-051912 | 2/1998 |
| JP | 11-312768 | 11/1999 |
| JP | 2002-100715 | 4/2002 |
| JP | 2003-273319 | 9/2003 |
| JP | 2008-282931 | 11/2008 |
| JP | 2010-187504 | 8/2010 |
| JP | 2011-103395 | 5/2011 |
| JP | 2011-114176 | 6/2011 |
| JP | 2013-110181 | 6/2013 |
| JP | 2014-154391 | 8/2014 |
| WO | WO 2005/091692 | 9/2005 |
| WO | WO 2013/054413 A1 | 4/2013 |
| WO | WO 2014/132425 | 9/2014 |

OTHER PUBLICATIONS

Written Opinion of the ISA for PCT/JP2015/061323, dated Jun. 30, 2015, 5 pages.

International Search Report for PCT/JP2014/078744, dated Feb. 3, 2015, 4 pages.

Extended European Search Report dated May 3, 2018 in European Application No. 15856013.6 (7 pages).

* cited by examiner

HEAT DISSIPATING STRUCTURE

TECHNICAL FIELD

The present invention relates to a heat dissipating structure.

This application is the U.S. national phase of International Application No. PCT/JP2015/061323, filed Apr. 13, 2015, which designated the U.S. and claims priority to International Application No. PCT/JP2014/078744, filed Oct. 29, 2014, the entire contents of each of which are incorporated herein by reference.

BACKGROUND ART

For example, as a heat dissipating structure of heat generating components such as electronic components, a heat dissipating structure using a heat sink is known (see Patent Document 1). A heat dissipating structure of Patent Document 1 uses a heat sink including a base portion, and a plurality of heat dissipating fins provided upright on a first surface of the base portion. On a second surface opposite to the first surface of the base portion, all the heat generating components to be cooled are disposed. Heat of the heat generating components transmits via the base portion to the heat dissipating fins, and thus is dissipated from the heat dissipating fins to the outside.

CITATION LIST

Patent Document

[Patent Document 1] Japanese Unexamined Patent Application, First Publication

DISCLOSURE OF THE INVENTION

Problems to be Solved by the Invention

In the above-described heat dissipating structure using the heat sink, although the contrivance such as the provision of the heat dissipating fins in order to increase heat dissipation performance, there is room for further improvements in terms of the heat dissipation performance. For example, in a case where heat generating components that generate a relatively large amount of heat, such as power devices, are cooled, a heat dissipating structure with high heat dissipation performance is necessary.

Additionally, in the above-described heat dissipating structure described in Patent Document 1, a plurality of heat generating components and a plurality of electronic components that control the plurality of these heat generating components are disposed on the same surface side of the heat sink. In this case, it is necessary to dispose wires for electrically connecting the heat generating components and the electronic components on the same surface side of the heat sink. In this configuration, however, electric resistance increases due to an increase in the number of wires and complexity of wire routing, thus causing an increase in power loss.

One aspect of the present invention is to provide a heat dissipating structure that achieves high heat dissipation performance while reducing the electric resistance.

Means for Solving the Problems

A heat sink according to one embodiment of the present invention includes: a base portion having a first surface and a second surface which oppose each other; at least one heat dissipating fin extending vertically from the first surface, each of the at least one heat dissipating fin having an insertion groove extending from an end portion thereof toward the base portion, and a first fin portion and a second fin portion which are separated by the insertion groove; and a connector included in the base portion, the connector being above the insertion groove in plan view, and the connector being configured to electrically connect a first heat generating component to be inserted into the insertion groove from a side of the first surface and a second heat generating component to be disposed on a side of the second surface.

Effects of the Invention

According to one aspect of the present invention, the first heat generating component is disposed on the first surface side of the base portion while being made in contact with the heat dissipating fin, thus making it possible to efficiently perform heat dissipation. Additionally, the first heat generating component is electrically connected via the connector to the second heat generating component disposed on the second surface side, thus achieving the heat dissipating structure with high heat dissipation performance while reducing the electric resistance.

MODE FOR CARRYING OUT THE INVENTION

Figure 1:
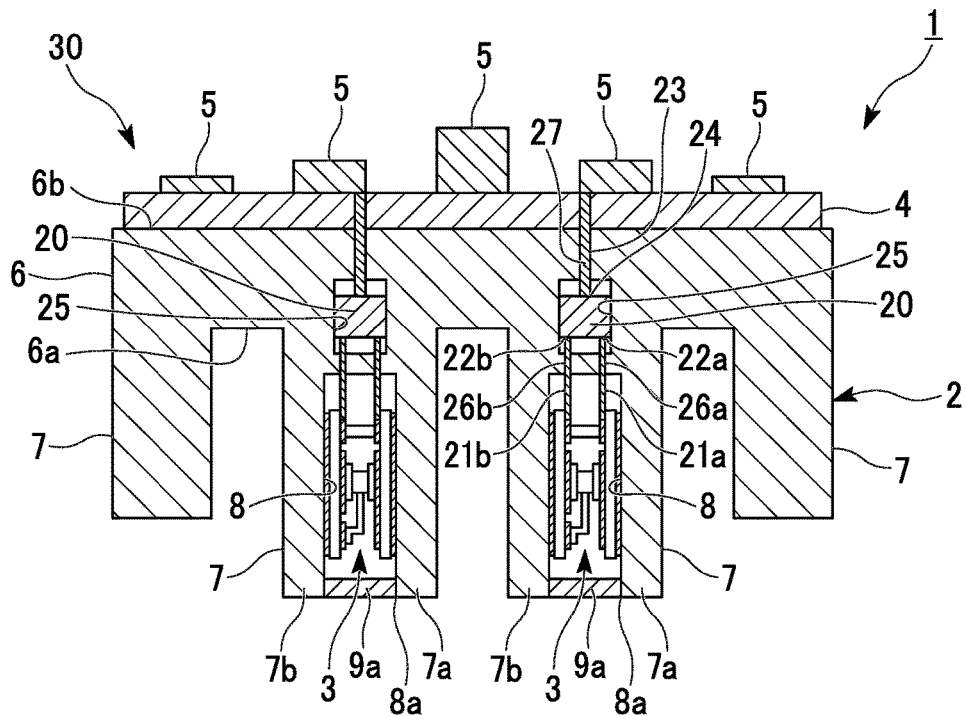
FIG. 1 is a cross-sectional view showing an example of a heat dissipating structure according to an embodiment of the present invention.

Hereinafter, embodiments of the present invention will be described in detail with reference to the accompanying drawings.

Here, in the following description, for clarification of respective components, some components are occasionally illustrated in different scale size in the drawings.

Figure 2:
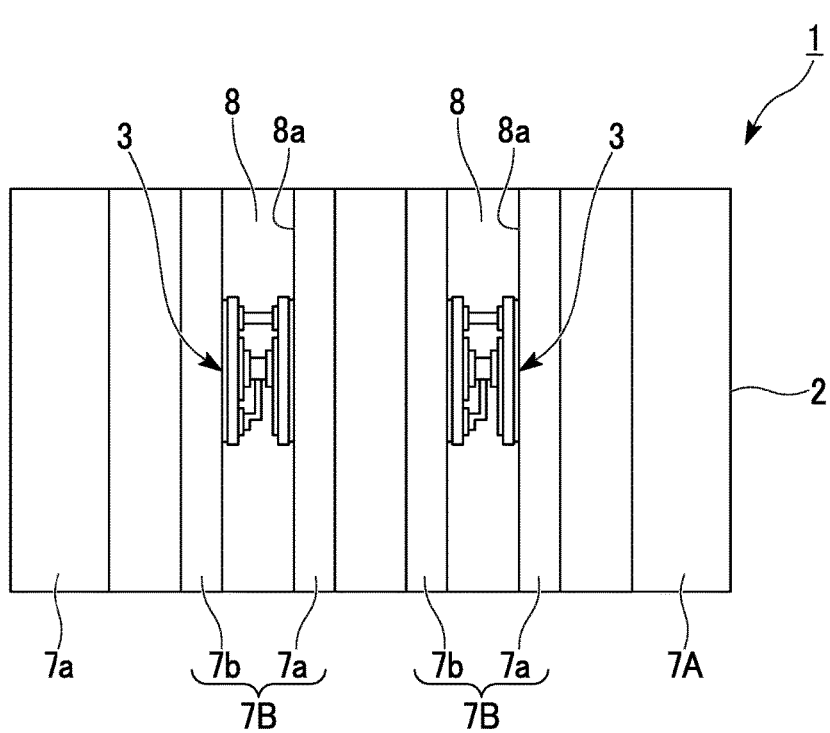
FIG. 2 is a plan view, viewed from a first surface side, showing the heat dissipating structure shown in FIG. 1.

With reference to FIGS. 1 and 2, a heat dissipating structure 1 according to an embodiment of the present invention will be described.

As shown in FIGS. 1 and 2, the heat dissipating structure 1 is a structure of a semiconductor device including a heat sink 2, a plurality of semiconductor modules (first heat generating components) 3, a circuit board 4, and a plurality of electronic components (second heat generating components) 5, wherein heat generated by the semiconductor modules 3 and the electronic components 5 is dissipated via the heat sink 2.

Specifically, in this heat dissipating structure 1, the heat sink 2 is made of, for example, a material having a high thermal conductivity, such as Cu and Al. The heat sink 2 has a base portion 6 and a plurality of heat dissipating fins 7A and 7B. The base portion 6 is formed in a rectangular plate shape. Each of the heat dissipating fins 7A and 7B is formed in a rectangular plate shape and is provided perpendicularly to a first surface 6a of the base portion 6. Additionally, the plurality of heat dissipating fins 7A and 7B are positioned at both ends, and between the both ends, in a long direction (horizontal direction in FIG. 2), of the base portion 6. The plurality of heat dissipating fins 7A and 7B are arranged while being spaced from one another. Further, each of the heat dissipating fins 7A and 7B is provided upright between both ends, in a short direction (vertical direction in FIG. 2), of the base portion 6.

In the present embodiment, the plurality of heat dissipating fins 7A and 7B are provided in the long side direction of the base portion 6 such that the two heat dissipating fins 7A are positioned along the both ends, in the long side direction, of the base portion 6, and the two heat dissipating fins 7B are positioned between the two heat-dissipating fins 7A. Additionally, the heat dissipating fins 7B have larger dimensions in the height and thickness directions than the heat dissipating fins 7A, since a semiconductor module 3 is disposed into the heat dissipating fin 7B. Here, the heat sink 2 is not necessarily limited to those of this embodiment, and can be implemented by appropriately modifying the number, size, or the like of the respective heat dissipating fins 7A and 7B.

The heat dissipating fin 7B is provided with an insertion groove 8. The insertion groove 8 holds the semiconductor module 3 that is insertable from an insertion opening 8a provided on an end side of the heat dissipating fin 7B. Specifically, the insertion groove 8 is a notch extending perpendicularly to the first surface 6a from the end side of the heat dissipating fin 7B, having a constant width, and having a depth enough to insert the semiconductor module 3 therein. The heat dissipating fin 7B is divided by the insertion groove 8 into two fin portions 7a and 7b.

Additionally, the heat dissipating fin 7B is provided with a lid member 9a (not shown in FIG. 2) that closes the insertion opening 8a. The lid member 9a is mounted so as to close the insertion opening 8a in a state where the semiconductor module 3 is inserted into the insertion groove 8. Here, the mounting structure of the lid member 9a is not necessarily limited to this structure, and may be a structure such that the lid member 9b (clamping member) is mounted so as to sandwich the heat dissipating fin 7B from the width direction of the insertion groove 8, as shown in later-described FIG. 11A to 11D. Additionally, the lid member 9a may be omitted.

Figure 3:
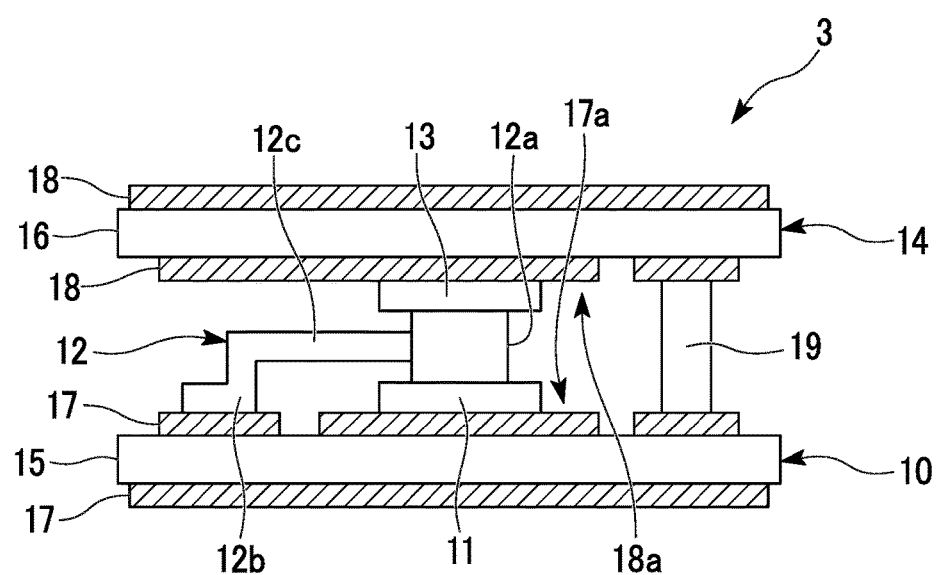
FIG. 3 is an enlarged cross-sectional view showing a semiconductor module shown FIG. 1.

As shown enlarged in FIG. 3, the semiconductor module 3 includes a first substrate 10, a first semiconductor element 11, a connector 12, a second semiconductor element 13, and a second substrate 14, which are layered in this order.

Among these, the first and second substrates 10 and 14 are ceramic substrates, and respectively include ceramic plates (insulating plates) 15 and 16, and Cu layers (conductive layers) 17 and 18 provided on both surfaces of the respective ceramic plates 15 and 16. Additionally, the Cu layers 17 and 18 respectively on the opposing surface sides of the first substrate 10 and the second substrate 14 form respective circuit pattern 17a and 18a of the semiconductor module 3. Here, the first and second substrates 10 and 14 are not limited to the ceramic substrates, and may be, for example, aluminum substrates. An aluminum substrate has a structure such that Cu layers are provided on both surfaces of the aluminum plate through insulating layers.

The first and second semiconductor devices 11 and 13 are power devices, such as power diodes or power transistors, which generate a relatively large amount of heat during operation. The first semiconductor element 11 and the second semiconductor element 13 are mounted respectively on the opposing surface sides of the first substrate 10 and the second substrate 14, thus being electrically connected to the respective circuit patterns 17a and 18a.

The connector 12 is made of a conductive material, such as Cu. The connector 12 has a first connecting portion 12a, a second connecting portion 12b, and a bridging portion 12c. Among these, the first connecting portion 12a is a portion electrically connecting the first semiconductor element 11 and the second semiconductor element 13. The second connecting portion 12b is a portion to be electrically connected to one of the circuit patterns 17a. The bridging portion 12c is a portion connecting the first connecting portion 12a and the second connecting portion 12b.

The first connecting portion 12a is formed in a columnar shape with a thickness sufficient to keep a distance between the first substrate 10 and the second substrate 14. Both end portions of the first connecting portion 12a are joined to the first semiconductor element 11 and the second semiconductor element 13 through a conductive adhesive (not shown), such as solder. The second connecting portion 12b is formed in a plate shape, and is joined to the one of the circuit patterns 17a through a conductive adhesive (not shown), such as solder. The bridging portion 12c is formed in an elongated plate shape with a length enough to connect the first connecting portion 12a and the second connecting portion 12b. One end side of the bridging portion 12c is integrally connected to a side surface of the first connecting portion 12a. The other end side of the bridging portion 12c is bent to the second connecting portion 12b side, thus being integrally connected to the second connecting portion 12b.

A spacer 19 is disposed between the first substrate 10 and the second substrate 14. The spacer 19, along with the first connecting portion 12a, keeps the distance between the first substrate 10 and the second substrate 14. Additionally, the spacer 19, as a circuit component of the semiconductor module 3, is disposed in a state of being sandwiched between the circuit patterns 17a and 18a. Examples of circuit components include a wiring portion, a resistor, a capacitor, and the like.

The circuit board 4 and the plurality of electronic components 5 shown in FIGS. 1 and 2 constitute a controller 30 that controls driving of the semiconductor module 3. Among these, the circuit board 4 is bonded onto the second surface 6b, opposite to the first surface 6a, of the heat sink 2 (base portion 6). On the other hand, the plurality of electronic components 5 are mounted on the circuit board 4. Each electronic component 5 is a heat generating component that generates a smaller amount of heat than each semiconductor module 3.

Some electronic components 5 of the plurality of electronic components 5 and the semiconductor modules 3 are electrically connected via a connector 20. The connector 20 has first outlets 22a and 22b into which the first connecting terminals 21a and 21b on the semiconductor module 3 side are inserted, and a second outlet 24 into which a second connecting terminal 23 on the electronic component 5 side is inserted. The first connecting terminals 21a and 21b on the semiconductor module 3 side, although not shown in FIG. 3, are connected respectively to the circuit patterns 17a and 18a.

The heat sink 2 is provided with an insertion hole 25 which insertably holds the connector 20. The heat sink 2 is provided with first through-holes 26a and 26b through which the first connecting terminals 21a and 21b on the semiconductor module 3 side are penetrable. The first through-holes 26a and 26b are formed from the bottom surface of the insertion groove 8 toward the insertion hole 25. The heat sink 2 and the circuit board 4 are provided with a second through-hole 27 through which the second connecting terminal 23 on the electronic component 5 side is penetrable. The second through-hole 27 is formed from the surface of the circuit board 4 mounted with the electronic components 5, toward the insertion hole 25. Additionally, time first connecting terminals 21a, 21b and the second connecting terminal 23 are electrically insulated from the first through-holes 26a, 26b and the second through-hole 27.

In the heat dissipating structure 1 having the above stricture, the semiconductor modules 3, in the state of being inserted into the insertion grooves 8, are in contact with the respective heat-dissipating fins 7B. Thereby, heat emitted by the semiconductor module 3 transmits from the inner wall surfaces of the insertion groove 8, that are, from the first and second substrates 10 and 14 in contact with the fin portions 7a and 7b, to the heat dissipating fins 7B, thus being dissipated to the outside. On the other hand, heat emitted by the plurality of electronic components 5 transmits from the circuit board 4 through the base portion 6 to the heat dissipating fins 7A and 7B, thus being dissipated to the outside. In this case, the heat emitted by the semiconductor module 3 directly transmits to the heat-dissipating fins 7B without through the base portion 6, thus shortening the heat transfer path, thereby increasing the heat dissipation performance of the semiconductor module 3.

As described above, in the heat dissipating structure 1 of the present embodiment, the semiconductor modules 3 are disposed in contact with the heat dissipating fins 7B, thereby making it possible to achieve high heat dissipation performance compared to conventional cases where the semiconductor modules 3 are disposed on the second surface 6b of the base portion 6.

Additionally, in the heat dissipating structure 1 of the present embodiment, the semiconductor modules 3 are disposed in the state of being inserted in the insertion grooves 8, thus enabling miniaturization compared to the conventional cases where the semiconductor modules 3 are disposed on the second surface 6b of the base portion 6. Further, the first and second substrates 10 and 14 of the semiconductor module 3 are made in contact with the fin portions 7a and 7b, thereby making it possible to efficiently perform the heat dissipation from the semiconductor modules 3.

Moreover, in the heat dissipating structure 1 of the present embodiment, the first semiconductor modules 3 disposed on the first surface 6a side of the base portion 6 are electrically connected via the connectors 20 to the electronic components 5 disposed on the second surface 6b side of the base portion 6. Thus, it is possible to connect the semiconductor modules 3 and the electronic components 5 by a short distance, thus making it possible to reduce the electrical resistance and to reduce the power loss.

Figure 4A:
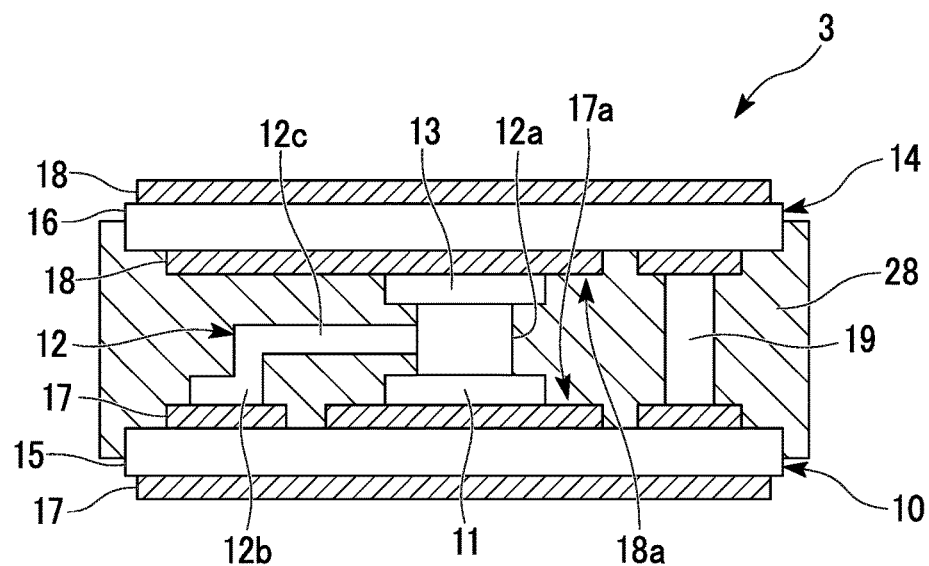
FIG. 4A is a schematic cross-sectional view showing a semiconductor module provided with a molding resin.

Incidentally, regarding the semiconductor module 3, as schematically shown in FIG. 4A in order for ensuring of the insulation and protection against particles, a mold resin 28 is provided to seal the opposing surface sides of the first substrate 10 and the second substrate 14. However, such a mold resin 28 is likely to cause cracking and the like during thermal expansion, due to a large difference in linear expansion coefficient between the first and second semiconductor elements 11, 13 and the first and second substrates 10, 14.

Figure 4B:
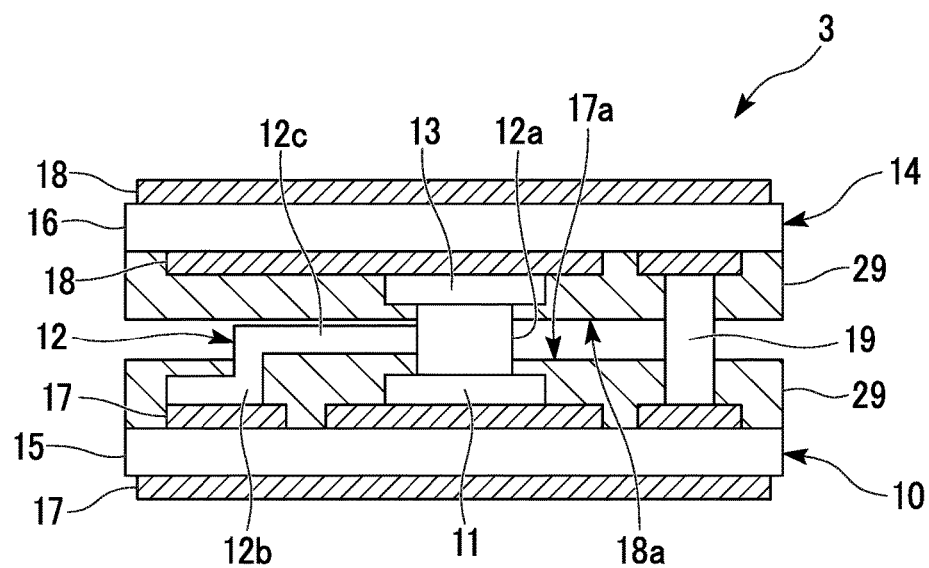
FIG. 4B is a schematic cross-sectional view showing a semiconductor module provided with an insulating film.

In contrast, in the present invention, as schematically shown in FIG. 4B, a configuration may be such that in place of the mold resin 28, an insulating film 29 is provided to cover the opposing surfaces of the first substrate 10 and the second substrate 14. As the insulating film 29, an insulating material with high thermal conductivity, such as ceramic, is used.

In the heat dissipating structure 1 of the present embodiment, the semiconductor module 3 provided with such an insulating film 29 is inserted into the insertion groove 8, thereby making it possible to achieve securing of the insulation and protection against the particles. Additionally, in a case where the insulating film 29 is provided, not only the heat dissipation performance from the semiconductor modules 3 is enhanced by thinning the insulating film 29, but also it becomes possible to suppress generation of cracks due to the difference in linear expansion coefficient. Further, since a step for sealing with the molding resin 28 can be omitted, thereby enabling simplification of the manufacturing process.

Here, the present invention is not necessarily limited to the above embodiment, and various modifications may be added without departing from the scope of the present invention.

In the present invention, for example, it is also possible to change the connecting structure of the above-described connector 20 that connects the semiconductor module 3 and the electronic component 5. Hereinafter, modified examples of the connector 20 will be described.

First Modified Example

Figure 5A:
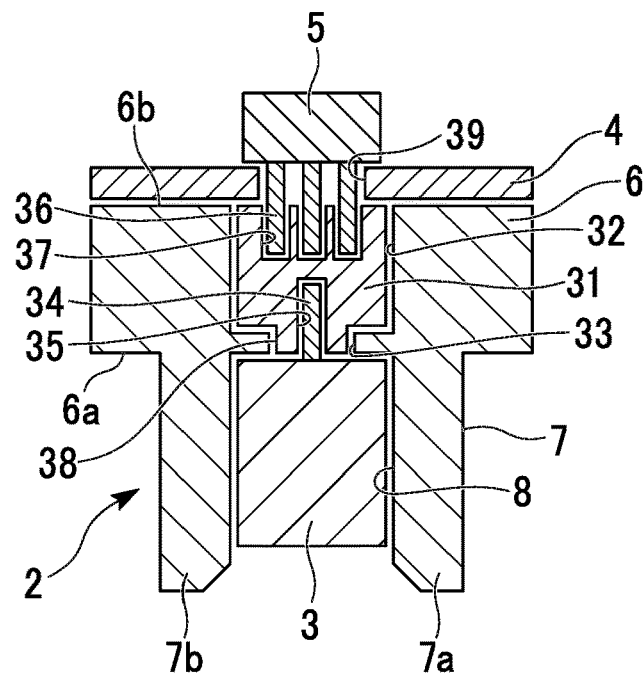
FIG. 5A is a cross-sectional view showing a first modified example of a connecting structure of a connector according to the present embodiment.
Figure 5B:
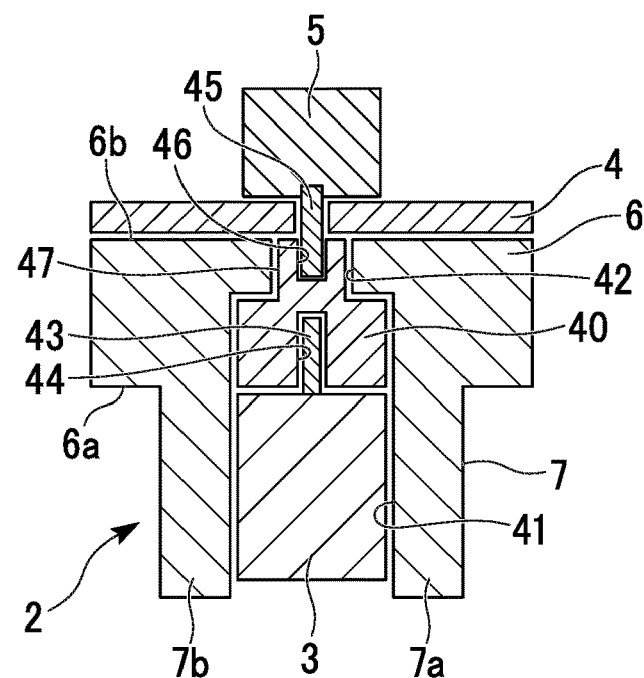
FIG. 5B is a cross-sectional view showing another first modified example of the connecting structure of the connector according to the present embodiment.

FIGS. 5A and 5B are views illustrating first modified examples of the connecting structure of the connector 20 according to the present embodiment. A connecting structure of a connector 31 according to the present first modified example has a configuration provided with, in place of the above-described insertion hole 5, an insertion groove 32 which holds the connector 31 that is insertable from the second surface 6b side of the base portion 6. Additionally, a through-hole 33 is provided between a bottom surface of the insertion groove 32 and the bottom surface of the insertion groove 8. A hole dimension (horizontal width) of the through-hole 33 is smaller than a groove dimension (horizontal width) of the insertion groove 32. The connector 31 has a first outlet 35 into which a first connecting terminal 34 on the semiconductor module 3 side is insertable, a plurality of second outlets 37 into which a plurality of second connecting terminals 36 on the electronic component 5 side are insertable, and a protruding portion 38 to fit into the through-hole 33. The circuit board 4 is provided with a through-hole 39 through which the plurality of second connecting terminals 36 are penetrable.

On the other hand, a connecting structure of a connector 40 shown in FIG. 5B has a configuration provided with, in place of the insertion hole 25, an insertion groove 41 that holds the connector 40 and the semiconductor module 3 that are insertable from the first surface 6a side of the base portion 6. Additionally, the insertion groove 41 is provided with a through-hole 42. A hole dimension (horizontal width) of the through-hole 42 is smaller than a groove dimension (horizontal width) of the insertion groove 41. The connector 40 has a first outlet 44 into which a first connecting terminal 43 on the semiconductor module 3 side is insertable, a second outlet 46 into which a second connecting terminal 45 on the electronic component 5 side is insertable, and a protruding portion 47 to fit into the through-hole 42.

As described above, it is also possible to employ, in the first modified example of the present embodiment, the connecting structure of the connector 31 shown in FIG. 5A, or the connecting structure of the connector 40 shown in FIG. 5B.

Second Modified Example

Figure 6A:
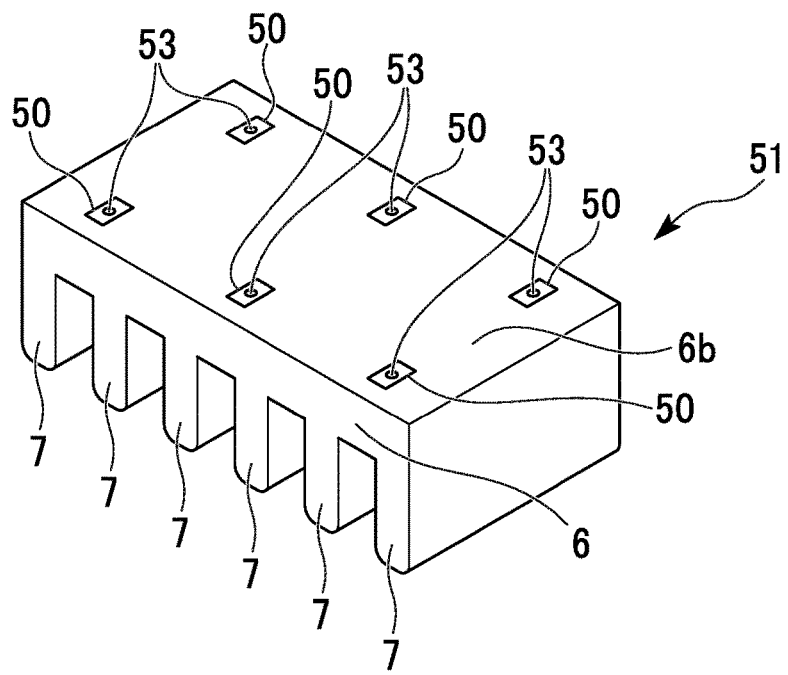
FIG. 6A is a perspective view, viewed from a second surface side, showing a heat sink according to a second modified example of the present embodiment.
Figure 6B:
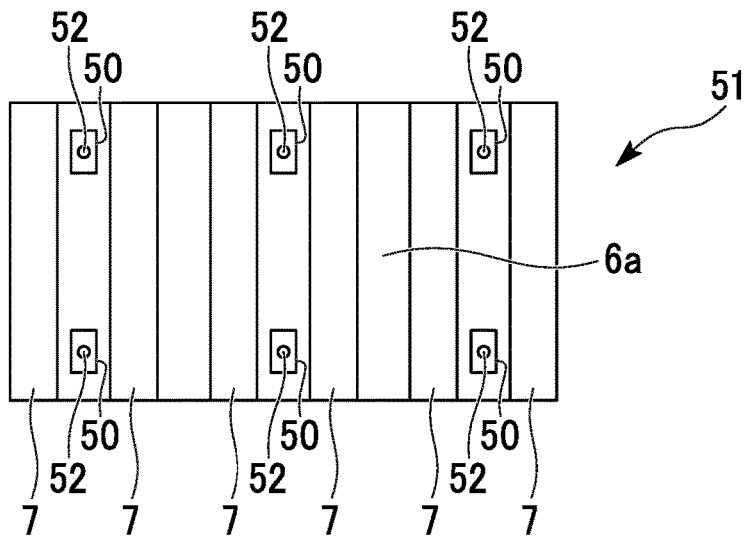
FIG. 6B is a perspective view, viewed from a first surface side, showing the heat sink according to the second modified example of the present embodiment.

FIGS. 6A and 6B are views illustrating a second modified example of the connecting structure of the connector 20 according to the present embodiment. In the present second modified example, a heat sink 51 previously provided with a plurality of connectors 50 is used. Each of the plurality of connectors 50 has a first outlet 52 on the first surface 6a of the base portion 6 and a second outlet 53 on the second surface 6b of the base 6, so that the connecting terminal of the semiconductor module 3 inserted between the heat dissipating fins 7 is insertable into the first outlet 52, and the connecting terminal of the electronic component 5 is insertable into the second outlet 53. Here, arrangement, the number, and the like of the plurality of connectors 50 can be changed arbitrarily.

Third Modified Example

Figure 7A:
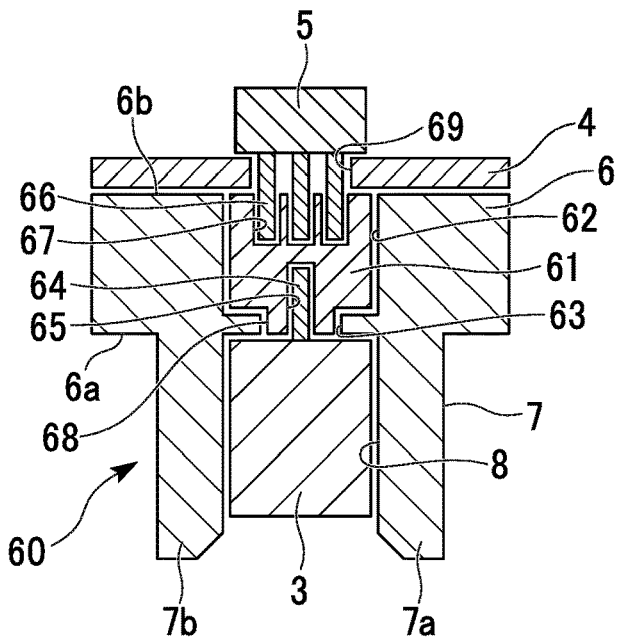
FIG. 7A is a cross-sectional view showing a third modified example of the connecting structure of the connector according to the present embodiment.
Figure 7B:
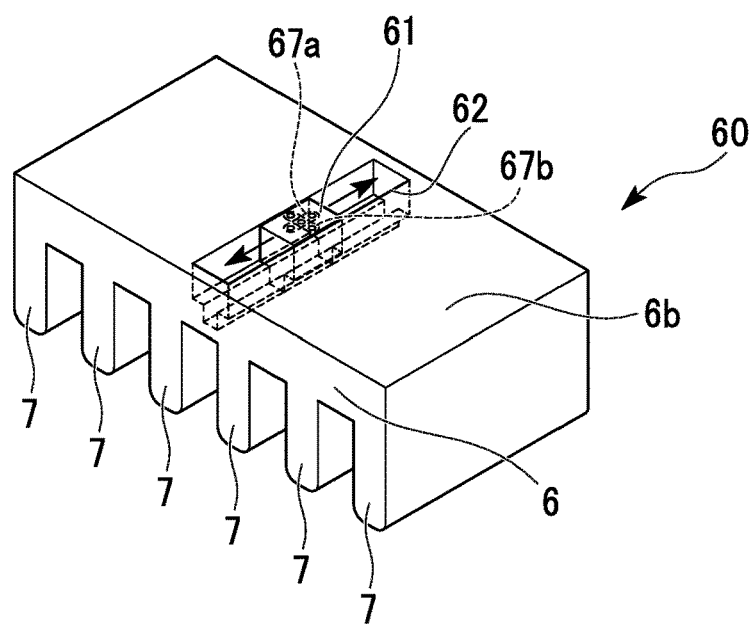
FIG. 7B is a perspective view, viewed from the second surface side, showing the heat sink according to the third modified example of the present embodiment.
Figure 7C:
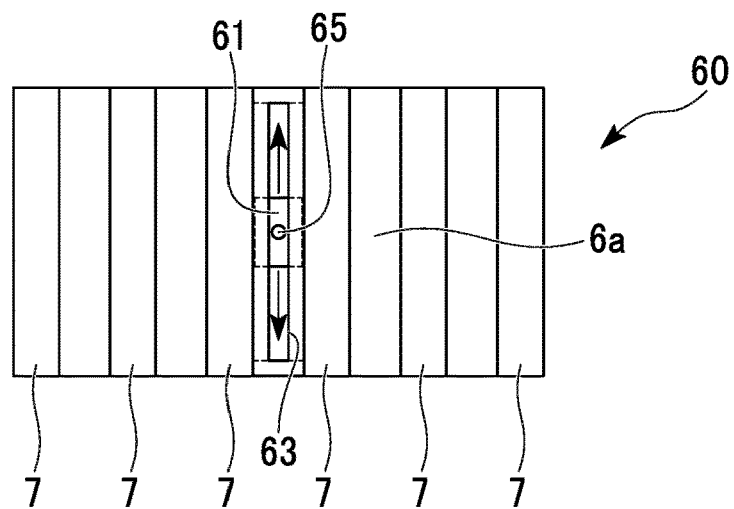
FIG. 7C is a perspective view, viewed from the first surface side, showing the heat sink according to the third modified example of the present embodiment.

FIGS. 7A to 7C are views illustrating a third modified example of the connecting structure of the connector 20 according to the present embodiment. A connecting structure (heat sink 60) of a connector 61 according to the present third modified example has a configuration that the connector 61 is slidably mounted on the heat sink 60. Here, for clarification of the configuration of the connector 61 itself, illustration of the semiconductor modules 3, the circuit board 4, and the electronic components 5 is omitted in FIGS. 7B and 7C. Additionally, although only one connector 61 is shown in FIGS. 7B and 7C, the number of connectors 61 can be changed arbitrarily.

The connecting structure of the connector 61 (heat sink 60) has a configuration provided with, in place of the insertion hole 25, slide grooves 62 and 63 that slidably hold the connector 61 that is insertable from the second surface 6b side of the base portion 6 of the heat sink 60. The slide groove (first slide groove) 62 extends from the second surface 6b toward the first surface 6a of the base portion 6 of the heat sink 60. The slide groove (second slide groove) 63 extends from the first surface 6a toward the second surface 6b of the base portion 6 of the heat sink 60, and connects the slide groove 62 and the insertion groove 8. In other words, the slide grooves 62 and 63 penetrate through the base portion 6 in a direction from the first surface 6a toward the second surface 6b (vertical direction). A groove dimension (horizontal width) of the slide groove 63 is smaller than a groove dimension (horizontal width) of the slide groove 62. For this reason, even when the connector 61 is inserted into the slide grooves 62 and 63 from the second surface 6b side of the base portion 6 of the heat sink 60, the connector 61 does not fall from the slide grooves 62 and 63.

The slide grooves 62 and 63 are provided in the base portion 6 of the heat sink 60, between the adjacent fin portions 7a and 7b (i.e., above the insertion groove 8) in plan view, and extends parallel to the extending direction of the fin portions 7a and 7b which extend along the first surface 6a of the base portion 6 (i.e., parallel to the insertion groove 8). Both end portions (i.e., both side surfaces), in the extending direction, of the slide grooves 62 and 63 are positioned inside the first surface 6a (or the second surface 6b) of the base portion 6 of the heat sink 60 in plan view; as shown in FIG. 7C. In other words, the slide grooves 62 and 63 penetrate through the base portion 6 in the direction from the first surface 6a toward the second surface 6b of the base portion 6 (vertical direction), but do not penetrate through the base portion 6 in a direction parallel to the first and second surfaces 6a and 6b of the base portion 6 (horizontal direction). For this reason, the connector 61 is slidable in the slide grooves 62 and 63 in the extending direction of the slide grooves (i.e., in parallel to the insertion groove 8) without falling from the slide grooves 62 and 63.

The connector 61 has a first outlet 65 into/from which a first connecting terminal 64 of the semiconductor module 3 is attachable/detachable, a plurality of second outlets 67 into/from which a plurality of second connecting terminals 66 of the electronic component 5 are attachable/detachable, and a protruding portion 68 to fit into the through-hole 63. The first outlet 65 extends from a surface (third surface) of the two opposing surfaces of the connector 61 which is on the first surface 6a side of the base portion 6 toward the other surface (fourth surface) on the second surface 6b side of the base portion 6. Additionally, the plurality of second outlets 67 extend from the surface (fourth surface) of the two opposing surfaces of the connector 61 which is on the second surface 6b side of the base portion 6 toward the other surface (third surface) on the first surface 6a side of the base portion 6.

As shown in FIG. 7B, the plurality of second outlets 67 includes a set of three second outlets 67a (first set) aligned parallel to the sliding direction of the connector 61 (extending direction of the slide groove), and a set of three second outlets 67b (second set) aligned vertical to the sliding direction of the connector 61 (extending direction of the slide groove). The first and second sets 67a and 67b have the common center second outlet. For this reason, the three second connecting terminals 66 of the electronic component 5 become attachable/detachable into/from any of the two sets of second outlets 67a and 67b.

Additionally, the circuit board 4 is provided with a through-slide groove 69 through which the plurality of second connecting terminals 66 are penetrable. A position of the through-slide groove 69 provided in the circuit board 4 overlaps positions of the slide grooves 62 and 63 provided in the connector 61 in plan view. Additionally, the plurality of second outlets 67 of the connector 61 are positioned inside the through-slide groove 69 in plan view.

According to this configuration, it becomes possible to slide the connector 61 along the slide groove 62, thereby making it possible to more freely determine the position of the electronic component 5 to be mounted on the circuit board 4, compared to the configuration in which the position of the connector is fixed. Additionally, the plurality of second connecting terminals 66 of the electronic component 5 becomes attachable/detachable into/from any one of the sets of the second outlets 67a and 67b, thereby making it possible to more freely determine the direction of the electronic component 5 when the electronic component 5 is mounted on the circuit board 4.

Fourth Modified Example

Figure 8A:
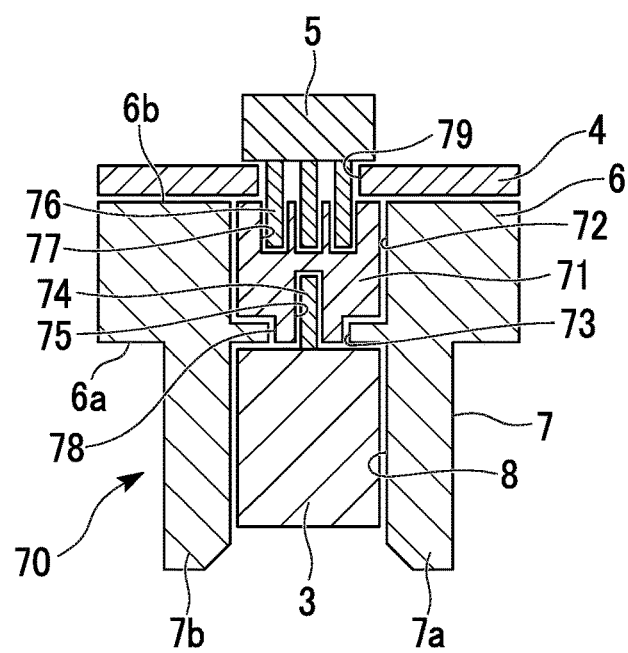
FIG. 8A is a cross-sectional view showing a fourth modified example of the connecting structure of the connector according to the present embodiment.
Figure 8B:
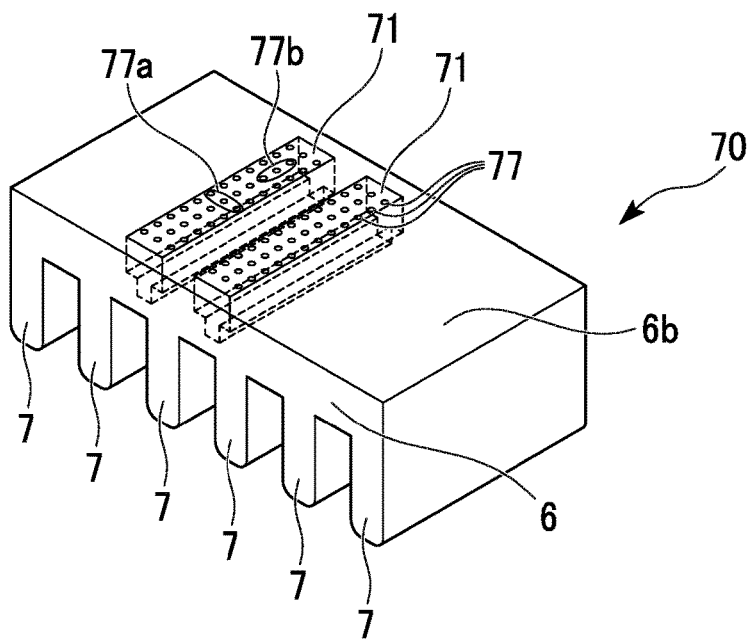
FIG. 8B is a perspective view, viewed from the second surface side, showing the heat sink according to the fourth modified example of the present embodiment.
Figure 8C:
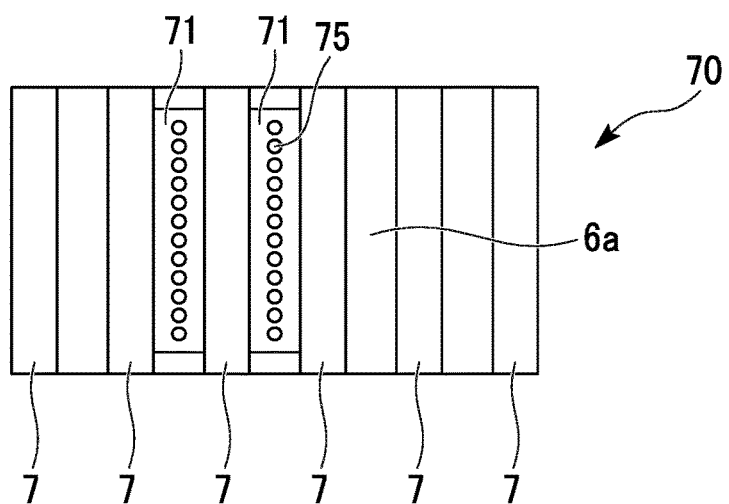
FIG. 8C is a perspective view, viewed from the first surface side, showing the heat sink according to the fourth modified example of the present embodiment.

FIGS. 8A to 8C are views illustrating a fourth modified example of the connecting structure of the connector 20 according to the present embodiment. A connecting structure (heat sink 70) of a connector 71 according to the present fourth modified example has a configuration that a plurality of second outlets 77 are provided in a grid in plan view so that a plurality of second connecting terminals 76 of the electronic component 5 are attachable/detachable thereinto/therefrom. Here, for clarification of the configuration of the connector 71 itself, illustration of the semiconductor modules 3, the circuit board 4, and the electronic components 5 is omitted in FIGS. 8B and 8C. Additionally, although only two connectors 71 are shown in FIGS. 8B and 8C, the number of connectors 71 may be changed arbitrarily.

The connecting structure (heat sink 70) of the connector 71 has a configuration provided with, in place of the above-described insertion hole 25, insertion grooves 72 and 73 which hold the connector 71 that is insertable from the second surface 6b side of the base portion 6. The insertion groove 72 extends from the second surface 6b toward the first surface 6a of the base portion 6 of the heat sink 70. The insertion groove 73 extends from the first surface 6a toward the second surface 6b of the base portion 6 of the heat sink 70, and connects the insertion groove 72 and the insertion groove 8. In other words, the insertion grooves 72 and 73 penetrate through the base portion 6 in a direction from the first surface 6a toward the second surface 6b (vertical direction). A groove dimension (horizontal width) of the insertion groove 73 is smaller than a groove dimension (horizontal width) of the insertion groove 72. For this reason, even when the connector 71 is inserted into the insertion grooves 72 and 73 from the second surface 6b side of the base portion 6 of the heat sink 70, the connector 71 does not fall from the insertion grooves 72 and 73.

The insertion grooves 72 and 73 are provided in the base portion 6 of the heat sink 70, between the adjacent fin portions 7a and 7b (i.e., above the insertion groove 8) in plan view, and extend parallel to the extending direction of the fin portions 7a and 7b which extend along the first surface 6a of the base portion 6 (i.e., parallel to the insertion groove 8). Both end portions (i.e., both side surfaces), in the extending direction, of the insertion grooves 72 and 73 are positioned inside the first surface 6a (or the second surface 6b) of the base portion 6 of the heat sink 70 in plan view, as shown in FIG. 8C. In other words, the insertion grooves 72 and 73 penetrate through the base portion 6 in the direction from the first surface 6a toward the second surface a of the base portion 6 (vertical direction), but do not penetrate through the base portion 6 in a direction parallel to the first and second surfaces 6a and 6b of the base portion 6 (horizontal direction). For this reason, the connector 61 is inserted into the insertion grooves 72 and 73 while being held without falling from the insertion grooves 72 and 73.

The connector 71 inserted into the insertion grooves 72 and 73 is positioned in the base portion 6 of the heat sink 70, between the adjacent fin portions 7a and 7b (i.e., above the insertion groove 8) in plan view, and extends parallel to the extending direction of the fin portions 7a and 7b which extend along the first surface 6a of the base portion 6 (i.e., parallel to the insertion groove 8). Both end portions (i.e., both side surfaces), in the extending direction, of the connector 71 are positioned inside the first surface 6a (or the second surface 6b)) of the base portion 6 of the heat sink 70 in plan view, as shown in FIG. 8C.

The connector 71 has a plurality of first outlets 75 into/from which a first connecting terminal 74 of the semiconductor module 3 is attachable/detachable, a plurality of second outlets 77 into/from which a plurality of second connecting terminals 76 of the electronic component 5 are attachable/detachable, and a protruding portion 78 to fit into the through insertion groove 73. The plurality of first outlets 75 extend from a surface (third surface) of the two opposing surfaces of the connector 71 which is on the first surface 6a side of the base portion 6 toward the other surface (fourth surface) on the second surface 6b side of the base portion 6. Additionally, the plurality of second outlets 77 extend from a surface (fourth surface) of the two opposing surfaces of the connector 71 which is on the second surface 6b side of the base portion 6 toward the other surface (third surface) on the first surface 6a side of the base portion 6.

As shown in FIG. 8C, the plurality of first outlets 75 are aligned in a line parallel to the extending direction of the insertion grooves 8, 72, and 73 on the surface (third surface) of the two opposing surfaces of the connector 71 which is on the first surface 6a side of the base portion 6, in plan view. For this reason, the first connecting terminal 74 of the semiconductor module 3 becomes attachable/detachable into/from any of the plurality of first outlets 75.

Additionally, as shown in FIG. 8B, the plurality of second outlets 77 arranged in a grid on the surface (fourth surface) of the two opposing surfaces of the connector 71, which is on the second surface 6b side of the base portion 6, in plan view. The plurality of second outlets 77 include a set of three second outlets 77a (first set) aligned vertical to the extending direction of the connector 71 (extending direction of the insertion grooves 8, 72, and 73), and a set of three second outlets 77b (second set) aligned parallel to the extending direction of the connector 71 (extending direction of the insertion grooves 8, 72, and 73). For this reason, three second connecting terminals 76 of the electronic component 5 become attachable/detachable into/from any of the plurality of first and second sets of second outlets 77a and 77b.

The circuit board 4 is provided with a through-slide groove 79 through which the plurality of second connecting terminals 76 are penetrable. A position of the through-slide groove 79 provided in the circuit board 4 overlaps positions of the slide grooves 72 and 73 provided in the connector 71 in plan view. Additionally, the plurality of second outlets 77 of the connector 71 are positioned inside the through-slide groove 79 in plan view.

This configuration makes it possible to freely select an outlet into which the first connecting terminal 74 of the semiconductor module 3 is to be inserted, from the plurality of first outlets 75 aligned in a line on the surface (third surface) on the semiconductor module 3 side of the connector 71. For example, it becomes possible to arrange two semiconductor modules 3 so as to be shifted away from each other through the heat dissipating fin 7, as shown in later-described FIG. 9C.

Similarly, it becomes possible to freely select an outlet into which the plurality of second connecting terminals 76 of the electronic component 5 are to be inserted, from the plurality of second outlets 77 arranged in a grid on the surface (fourth surface) on the electronic component 5 side of the connector 71. For example, it becomes possible to connect the three second connecting terminals 76 of the electronic component 5 into the set of three second outlets 77b so that the long side of the electronic component 5 becomes parallel to the long side of the connector 71. Similarly, it becomes possible to connect the three second connecting terminals 76 of the electronic component 5 into the set of three second outlets 77a so that the short side of the electronic component 5 becomes parallel to the long side of the connector 71. Thus, it becomes possible to freely determine disposition of the semiconductor module 3 and the electronic component 5 which are to be electrically connected by the connector 71.

Figure 9A:
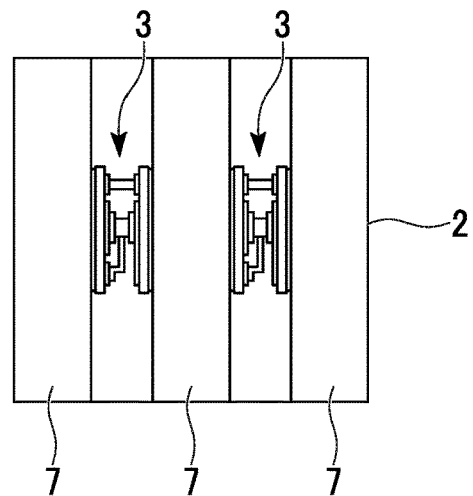
FIG. 9A is a plan view showing an example of disposition of the semiconductor module.
Figure 9B:
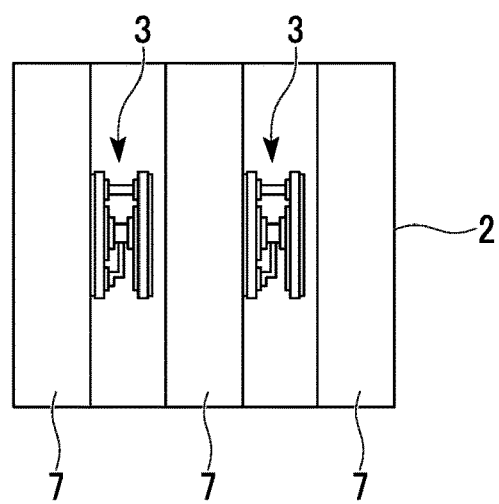
FIG. 9B is a plan view showing an example of disposition of the semiconductor module.
Figure 9C:
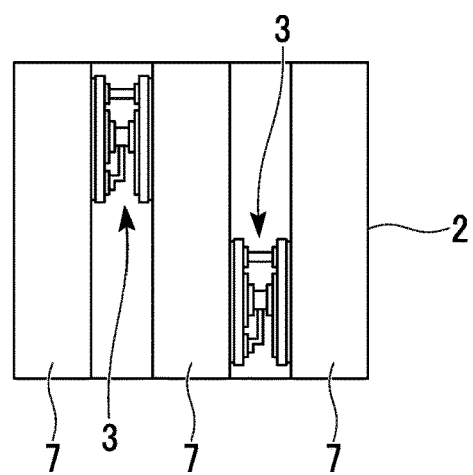
FIG. 9C is a plan view showing an example of disposition of the semiconductor module.

Additionally, a configuration may be such that the semiconductor module 3 is in contact with at least one heat dissipating fin 7A (7B) of the plurality of heat dissipating fins 7A and 7B. Accordingly, a configuration may be such that the semiconductor module 3 is sandwiched between the adjacent heat dissipating fins 7, as shown in FIG. 9A, or the semiconductor module 3 is in contact with one side surface of the heat dissipating fin 7, as shown in FIG. 9B. Further, a configuration of the semiconductor modules 3 is not limited to the above-described configuration that the semiconductor modules 3 are disposed facing each other through the heat dissipating fin 7. Instead, a configuration may be such that the semiconductor modules 3 are shifted away from each other through the heat dissipating fin 7, as shown in FIG. 9C.

Further, the first heat generating components of the present invention are not necessarily limited to the above-described semiconductor modules 3, and the arrangement, the number, and the like thereof can be modified appropriately. Additionally, the insertion groove 8 can be modified appropriately in accordance with the size of the first heat generating components. Accordingly, the plurality of heat dissipating fins 7 may be provided with insertion grooves 8 with different depths and widths in accordance with the size of the respective first heat generating components.

Moreover, the present invention is not limited to the configuration provided with the lid member 9a that closes the insertion opening of the above-described insertion groove 8. It is possible to employ a configuration provided with an insertion hole which insertably holds the semiconductor module 3, such as the above-described insertion hole 25.

Figure 10A:
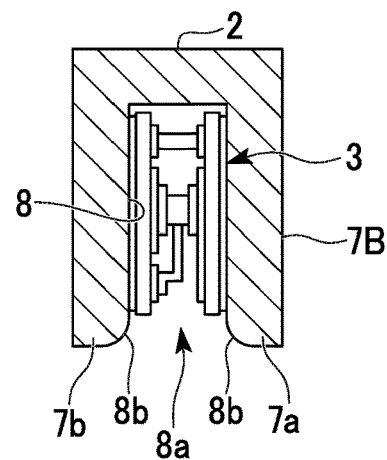
FIG. 10A is a cross-sectional view showing a modified example of an insertion groove.
Figure 10B:
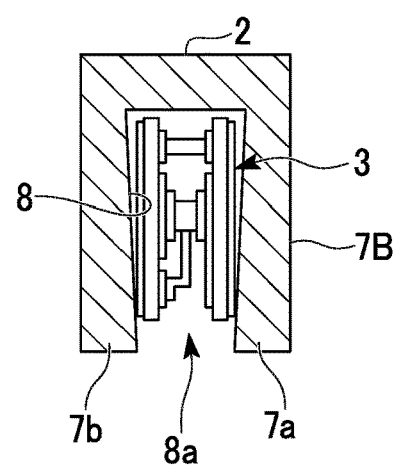
FIG. 10B is a cross-sectional view showing a modified example of the insertion groove.
Figure 10C:
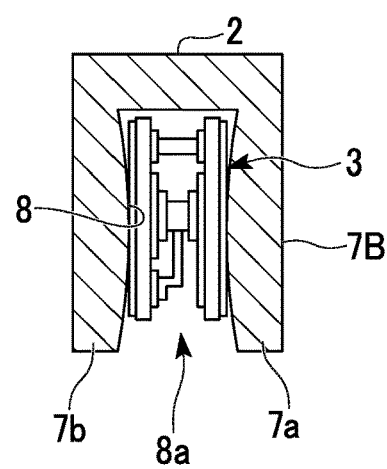
FIG. 10C is a cross-sectional view showing a modified example of the insertion groove.

Additionally, in the present invention, for example, as shown in FIG. 10A, in order to facilitate insertion of the semiconductor module 3 into the insertion groove 8, a configuration may be such that the insertion opening 8a is provided with a tapered portion 8b. Further, the insertion groove 8 is not limited to the above-described shape with a constant width. Instead, for example, a structure in a shape with a width gradually narrowed toward the end portion in the depth direction (so-called a wedge shape), as shown in FIG. 10B, or a structure in a shape with a width gradually narrowed toward the central portion in the depth direction (so-called an hourglass shape), as shown in FIG. 10C, may be employed in order to prevent the semiconductor module 3 inserted into the insertion groove 8 from being easily detached therefrom. Moreover, the semiconductor modules 3 are inflated during heat dissipation and thus adheres tightly onto the fin portions 7a and 7b, thereby making it possible to increase heat dissipation performance.

Figure 11A:
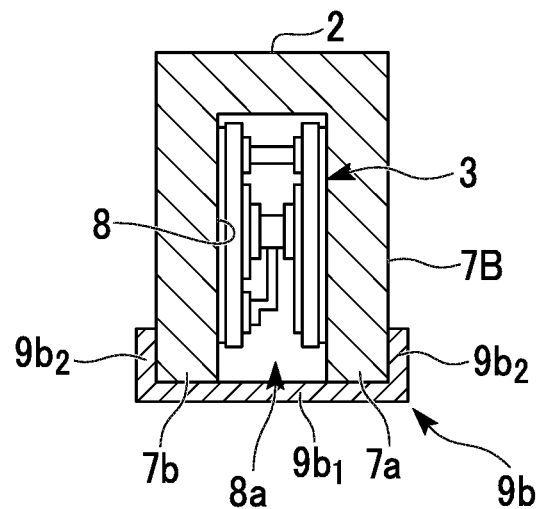
FIG. 11A is a cross-sectional view showing a clamping member.

Additionally, in the present invention, the end portion of the heat dissipating fin 7B may be provided with a clamping member 9b shown in FIG. 11A, in place of the lid member 9a shown in FIG. 1. The clamping member 9b includes a lid member $9b_1$ that covers the insertion opening 8a, and a pair of clamping portions $9b_2$ provided upright from the both end portions, in a width direction (horizontal direction in FIG. 1), of the lid member $9b_1$. The clamping member 9b is attached onto the end portion of the heat dissipating fin 7B such that while the semiconductor module 3 is inserted into the insertion groove 8, the lid member $9b_1$ covers the insertion opening 8a, and the pair of clamping portions $9b_2$ sandwich the fin portions 7a and 7b from the width direction of the insertion groove 8. This makes it possible to increase the adhesion of the semiconductor module 3 sandwiched between the pair of fin portions 7a and 7b against the fin portions 7a and 7b and to prevent the semiconductor module 3 inserted into the insertion groove 8 from falling therefrom.

Further, it is preferable that the clamping member 9b is made of a material with a smaller linear expansion coefficient than that of the heat dissipating fin 7B (heat sink 2). In this case, the clamping member 9b can prevent the fin portions 7a and 7b from widening outward when the heat dissipating fin 7B is thermally expanded by heat emitted from the semiconductor module 3. This makes it possible to further increase the adhesion between the semiconductor module 3 and the heat dissipating fin 7B (fin portions 7a and 7b).

Figure 11B:
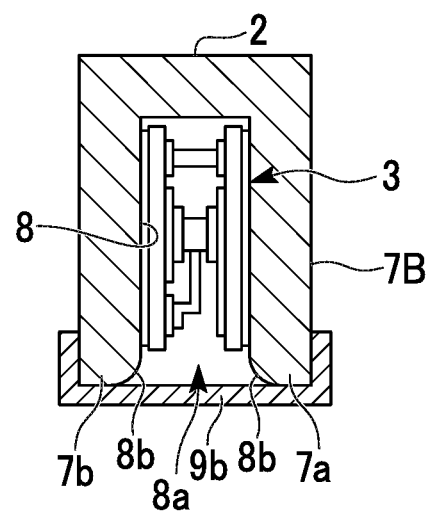
FIG. 11B is a cross-sectional view showing a clamping member.
Figure 11C:
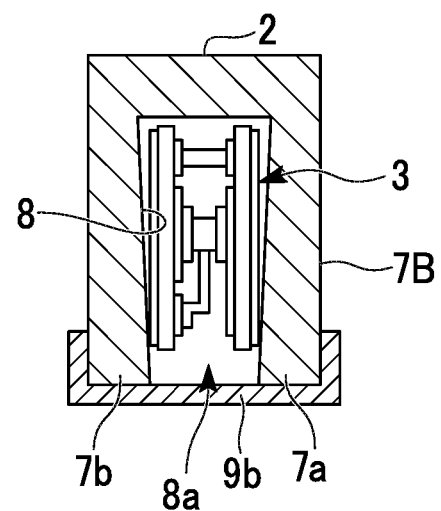
FIG. 11C is a cross-sectional view showing a clamping member.
Figure 11D:
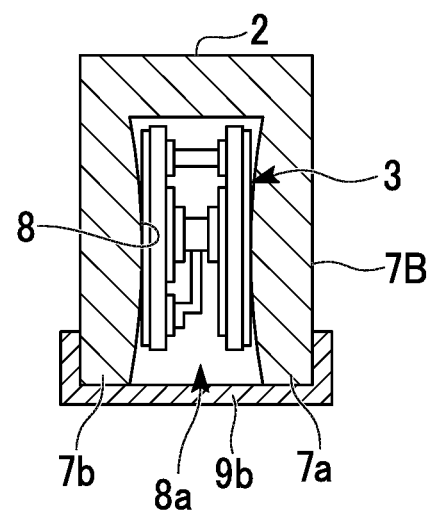
FIG. 11D is a cross-sectional view showing a clamping member.

Moreover, as shown in FIGS. 11B to 11D, the clamping member 9b shown in FIG. 11A may be applied to the heat dissipating fins 7B shown in FIGS. 10A to 10C. The structures shown in FIGS. 11B and 11C are all provided with the clamping member 9b that sandwiches the heat dissipating fin 7B from the width direction of the insertion groove 8, thereby making it possible to increase the adhesion between the semiconductor module 3 and the heat dissipating fin 7B (fin portions 7a and 7b). Further, when the heat dissipating fin 7B is thermally expanded by heat emitted from the semiconductor module 3, the clamping member 9b prevents the fin portions 7a and 7b from widening outward, thereby making it possible to further increase the adhesion between the semiconductor module 3 and the heat dissipating fin 7B (fin portions 7a and 7b). This makes it possible to sufficiently release heat emitted from the semiconductor module 3 toward the heat dissipating fin 7B even when an amount of heat emitted from the semiconductor module 3 increases, thereby making it possible to achieve high dissipation performance.

INDUSTRIAL APPLICABILITY

The present invention is applicable to heat dissipating structures using heat sinks.

DESCRIPTION OF REFERENCE NUMERALS 1 heat dissipating structure
2 heat sink
3 semiconductor module (first heat generating component)
4 circuit board
5 electronic component (second heat generating component)
6 base portion
6a first surface
6b second surface
7 heat dissipating fin
8 insertion groove
9a lid member
9b clamping member
10 first substrate
11 first semiconductor element
12 connector
13 second semiconductor element
14 second substrate
15, 16 ceramic plate (insulating plate)
17, 18 Cu layer (conductive layer)
17a, 18a circuit pattern
19 spacer
20 connector
21a, 21b first connecting terminal
22a, 22b first outlet
23 second connecting terminal
24 second outlet
25 insertion hole
26a, 26b first through-hole
27 second through-hole
28 mold resin
29 insulating film
30 controller
31 connector
32 insertion groove
33 through-hole
34 first connecting terminal
35 first outlet
36 second connecting terminal
37 second outlet
38 protruding portion
39 through-hole
40 connector
41 insertion groove
42 through-hole
43 first connecting terminal
44 first outlet
45 second connecting terminal
46 second outlet
47 protruding portion
50 connector
51 heat sink
52 first outlet
53 second outlet
60 heat sink
61 connector
62 slide groove
63 slide groove
64 first connecting terminal
65 first outlet
66 second connecting terminal
67 second outlet
68 protruding portion
69 through-slide groove
70 heat sink
71 connector
72 insertion groove
73 insertion groove
74 first connecting terminal
75 first outlet
76 second connecting terminal
77 second outlet
78 protruding portion
79 through-slide groove

The invention claimed is:

1. A heat sink comprising:
a base portion having a first surface and a second surface which oppose each other;
at least one heat dissipating fin extending vertically from the first surface, each of the at least one heat dissipating fin having an insertion groove extending from an end portion thereof toward the base portion, and a first fin portion and a second fin portion which are separated by the insertion groove; and
a connector included in the base portion, the connector being above the insertion groove in plan view, and the connector being configured to electrically connect a first heat generating component to be inserted into the insertion groove from a side of the first surface and a second heat generating component to be disposed on a side of the second surface, wherein
the connector has:
a third surface on the side of the first surface;
a fourth surface on the side of the second surface, the fourth surface opposing the third surface;
a first outlet extending from the third surface toward the fourth surface, a first connecting terminal of the first heat generating component being attachable and detachable into and from the first outlet; and
a second outlet extending from the fourth surface toward the third surface, a second connecting terminal of the second heat generating component being attachable and detachable into and from the second outlet,
the base portion has a slide groove extending parallel to the insertion groove, the base portion being above the insertion groove in plan view, and
the connector is slidable in the slide groove in parallel to the insertion groove.

2. The heat sink according to claim 1, further comprising:
a plurality of connectors including the connector, the plurality of connectors being included in the base portion, and the plurality of connectors being above the insertion groove in plan view.

3. The heat sink according to claim 1, wherein
the slide groove includes a first slide groove extending from the second surface toward the first surface, and a second slide groove extending from the first surface toward the second surface and connecting the first slide groove and the insertion groove, both end portions, in an extending direction, of the first slide groove, and both end portions, in an extending direction, of the second slide groove are positioned inside the first surface or the second surface of the base portion in plan view, and a groove dimension of the second slide groove is smaller than a groove dimension of the first slide groove.

4. The heat sink according to claim 1, wherein
the connector has a plurality of second outlets including the second outlet, the plurality of second outlets extending from the fourth surface toward the third surface, the plurality of second outlets including a first set of three second outlets aligned parallel to an extending direction of the slide groove, and a second set of three second outlets aligned vertical to the extending direction of the slide groove, the first set and the second set have a common center second outlet, the second heat generating component has three second connecting terminals including the second connecting terminal, and the three second connecting terminals are attachable and detachable into and from any of the first set and the second set.

5. A heat sink comprising:
a base portion having a first surface and a second surface which oppose each other;

at least one heat dissipating fin extending vertically from the first surface, each of the at least one heat dissipating fin having an insertion groove extending from an end portion thereof toward the base portion, and a first fin portion and a second fin portion which are separated by the insertion groove; and a connector included in the base portion, the connector being above the insertion groove in plan view, and the connector being configured to electrically connect a first heat generating component to be inserted into the insertion groove from a side of the first surface and a second heat generating component to be disposed on a side of the second surface, wherein the connector has:
a third surface on the side of the first surface;
a fourth surface on the side of the second surface, the fourth surface opposing the third surface;
a first outlet extending from the third surface toward the fourth surface, a first connecting terminal of the first heat generating component being attachable and detachable into and from the first outlet; and
a second outlet extending from the fourth surface toward the third surface, a second connecting terminal of the second heat generating component being attachable and detachable into and from the second outlet, the connector extends parallel to the insertion groove in plan view, and the connector has:
a plurality of first outlets including the first outlet, the plurality of first outlets being aligned parallel to the insertion groove on the third surface in plan view, and a plurality of second outlets including the second outlet, the plurality of second outlets being aligned in a grid on the fourth surface in plan view.

6. The heat sink according to claim 5, wherein
the first connecting terminal of the first heat generating component is attachable and detachable into and from any of the plurality of first outlets, and the second connecting terminal of the second heat generating component is attachable and detachable into and from any of the plurality of second outlets.

7. The heat sink according to claim 5, wherein
the plurality of second outlets including a first set of three second outlets aligned parallel to an extending direction of the connector, and a second set of three second outlets aligned vertical to the extending direction of the connector, the second heat generating component has three second connecting terminals including the second connecting terminal, and the three second connecting terminals are attachable and detachable into and from any of the first set and the second set.

8. The heat sink according to claim 5, wherein both end portions, in an extending direction, of the connector are positioned inside the first surface or the second surface of the base portion in plan view.

9. A heat dissipating structure comprising:
a heat sink comprising
a base portion having a first surface and a second surface which oppose each other, and
at least one heat dissipating fin extending vertically from the first surface, each of the at least one heat dissipating fin having an insertion groove extending from an end portion thereof toward the base portion, and a first fin portion and a second fin portion which are separated by the insertion groove;

a first heat generating component to be inserted into the insertion groove from a side of the first surface;
a circuit board on the second surface;
a second heat generating component on the circuit board; and
a connector included in the base portion, the connector being above the insertion groove in plan view, and the connector being configured to electrically connect the first heat generating component and the second heat generating component, wherein the connector has:
a third surface on the side of the first surface;
a fourth surface on the side of the second surface, the fourth surface opposing the third surface;
a first outlet extending from the third surface toward the fourth surface, a first connecting terminal of the first heat generating component being attachable and detachable into and from the first outlet; and
a second outlet extending from the fourth surface toward the third surface, a second connecting terminal of the second heat generating component being attachable and detachable into and from the second outlet, the base portion has a slide groove extending parallel to the insertion groove, the base portion being above the insertion groove in plan view, and the connector is slidable in the slide groove in parallel to the insertion groove.

* * * * *